US012770825B2

(12) United States Patent
Taniike et al.

(10) Patent No.: US 12,770,825 B2
(45) Date of Patent: Oct. 20, 2026

(54) PLASMA PROCESSING APPARATUS

(71) Applicant: TOKYO ELECTRON LIMITED, Tokyo (JP)

(72) Inventors: Yasuaki Taniike, Nirasaki City (JP); Masaki Hirayama, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 451 days.

(21) Appl. No.: 18/553,337

(22) PCT Filed: Mar. 25, 2022

(86) PCT No.: PCT/JP2022/014603
§ 371 (c)(1),
(2) Date: Sep. 29, 2023

(87) PCT Pub. No.: WO2022/215555
PCT Pub. Date: Oct. 13, 2022

(65) Prior Publication Data
US 2024/0186110 A1 Jun. 6, 2024

(30) Foreign Application Priority Data
Apr. 8, 2021 (JP) ................................ 2021-065766

(51) Int. Cl.
*H01J 37/32* (2006.01)

(52) U.S. Cl.
CPC .... *H01J 37/32082* (2013.01); *H01J 37/3244* (2013.01); *H01J 37/32568* (2013.01); *H01J 2237/002* (2013.01); *H01J 2237/334* (2013.01)

(58) Field of Classification Search
CPC ............ H01J 37/3244; H01J 37/32568; H01J 37/32082; H01J 2237/334; H01J 2237/002; H05H 1/46
See application file for complete search history.

(56) References Cited

FOREIGN PATENT DOCUMENTS

| | | | |
|---|---|---|---|
| JP | H11-111494 | A | 4/1999 |
| JP | 2009-21256 | A | 1/2009 |
| JP | 2014-116187 | A | 6/2014 |
| JP | 2020-92034 | A | 6/2020 |
| KR | 1020140074829 | A | 6/2014 |

*Primary Examiner* — Joseph A Miller, Jr.
(74) *Attorney, Agent, or Firm* — Nath, Goldberg & Meyer; Jerald L. Meyer; Tanya E. Harkins

(57) ABSTRACT

In a disclosed plasma processing apparatus, a metallic gas pipe extends in a direction crossing a coaxial waveguide and is connected to an inner conductor of the coaxial waveguide between one end and the other end of the inner conductor. The gas pipe is connected to a gas flow path of the inner conductor. The plasma processing apparatus includes a filter configured to prevent electromagnetic waves from propagating around the gas pipe. The filter includes a cylindrical cover conductor provided to surround the gas pipe. The cover conductor includes one end connected to an outer conductor of the coaxial waveguide and the other end that is a short-circuit end connected to the gas pipe.

20 Claims, 7 Drawing Sheets

PLASMA PROCESSING APPARATUS

This is a National Phase Application filed under 35 U.S.C. 371 as a national stage of PCT/JP2022/014603, filed Mar. 25, 2022, an application claiming the benefit of Japanese Patent Application No. 2021-065766, filed Apr. 8, 2021, the content of each of which is hereby incorporated by reference in its entirety.

TECHNICAL FIELD

Exemplary embodiments of the present disclosure relate to a plasma processing apparatus.

BACKGROUND

Patent Document 1 below discloses a plasma processing apparatus configured to generate plasma using VHF waves. Specifically, the plasma processing apparatus disclosed in Patent Document 1 includes a chamber, a lower electrode, an upper electrode, a coaxial waveguide, a transmitter (waveguide), a ring-shaped introducer, and a ring-shaped pipe. The lower electrode is provided inside the chamber. The upper electrode is provided above the lower electrode. The upper electrode is configured as a shower head. The coaxial waveguide extends vertically and is connected to the transmitter. The transmitter extends along the top surface and side surface of the upper electrode. The VHF waves propagate from the coaxial waveguide to the transmitter, and then propagate radially in the transmitter and are introduced into the chamber through the introducer. The ring-shaped pipe provides a gas introduction passage through which a gas is introduced into the shower head. The ring-shaped pipe is made of a dielectric material, extends through the transmitter, and is connected to the shower head.

PRIOR ART DOCUMENT

Patent Document

Patent Document 1: Japanese Laid-Open Patent Publication No. 2020-092034

The present disclosure provides a technique to prevent discharge within a gas pipe crossing a coaxial waveguide in a plasma processing apparatus, to prevent a decrease in power transmittance of electromagnetic waves in the coaxial waveguide, and to correct a mode of the electromagnetic waves in the coaxial waveguide.

SUMMARY

In one exemplary embodiment, there is provided a plasma processing apparatus. The plasma processing apparatus includes a chamber, a coaxial waveguide, an introducer, a shower head, one or more conductor parts, and one or more filters. The coaxial waveguide includes an outer conductor and an inner conductor which have a cylindrical shape. The inner conductor is provided inside the outer conductor and provides a gas flow path therein. The introducer is provided to introduce electromagnetic waves from the coaxial waveguide into the chamber. The shower head is connected to the gas flow path and provides a plurality of gas holes that are open toward an internal space of the chamber. The one or more conductor parts are made of a metal. The one or more conductor parts extend in a direction crossing the coaxial waveguide and are connected to the inner conductor between one end and the other end of the inner conductor.

The one or more conductor parts include a gas pipe connected to the gas flow path. The one or more filters are configured to prevent the electromagnetic waves from propagating around the one or more conductor parts. Each of the one or more filters includes a cylindrical cover conductor. The cover conductor is provided to surround a corresponding conductor part among the one or more conductor parts. The cover conductor includes one end connected to the outer conductor and the other end that is a short-circuit end connected to the corresponding conductor part.

According to one exemplary embodiment, it is possible to prevent discharge within a gas pipe crossing a coaxial waveguide in a plasma processing apparatus, to prevent a decrease in power transmittance of electromagnetic waves in the coaxial waveguide, and to correct a mode of the electromagnetic waves in the coaxial waveguide.

DETAILED DESCRIPTION

Figure 1:
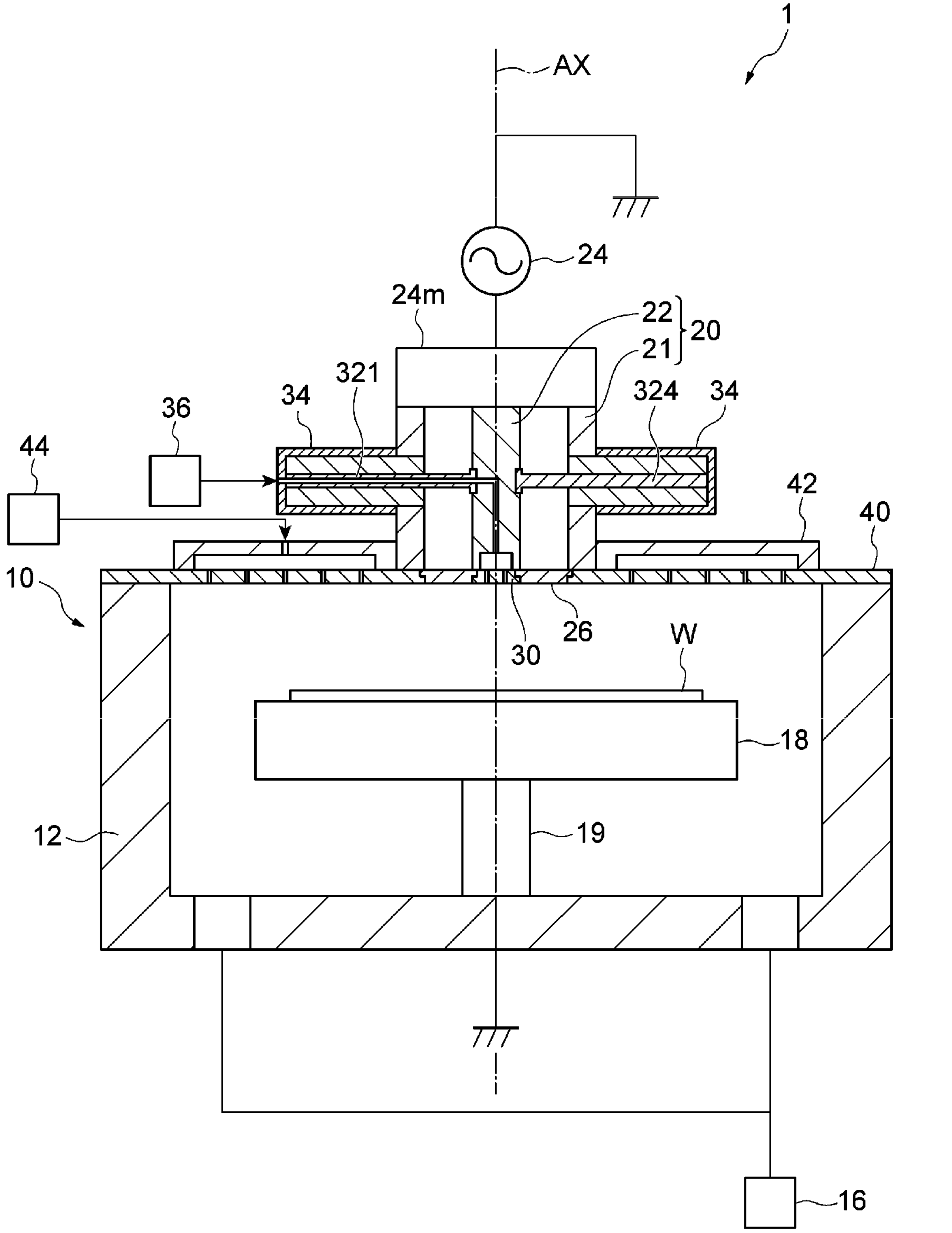
FIG. 1 is a view illustrating a plasma processing apparatus according to one exemplary embodiment.

Hereinafter, various exemplary embodiments will be described.

In one exemplary embodiment, a plasma processing apparatus is provided. The plasma processing apparatus includes a chamber, a coaxial waveguide, an introducer, a shower head, one or more conductor parts, and one or more filters. The coaxial waveguide includes an outer conductor and an inner conductor which have a cylindrical shape. The inner conductor is provided inside the outer conductor and provides a gas flow path therein. The introducer is provided to introduce electromagnetic waves from the coaxial waveguide into the chamber. The shower head is connected to the gas flow path and provides a plurality of gas holes that are open toward an internal space of the chamber. The one or more conductor parts are made of a metal. The one or more conductor parts extend in a direction crossing the coaxial waveguide and are connected to the inner conductor between one end and the other end of the inner conductor. The one or more conductor parts include a gas pipe connected to the gas flow path. The one or more filters are configured to prevent the electromagnetic waves from propagating around the one or more conductor parts. Each of the one or more filters includes a cylindrical cover conductor. The cover conductor is provided to surround a corresponding conductor part among the one or more conductor parts. The cover conductor includes one end connected to the outer conductor and the other end that is a short-circuit end connected to the corresponding conductor part.

According to the above plasma processing apparatus, it is possible to introduce a gas into the chamber via the gas pipe, the gas flow path of the inner conductor, and the shower head. Further, since the gas pipe is made of a metal, discharge within the gas pipe is prevented. Further, the one or more conductor parts cross the coaxial waveguide, and the propagation of the electromagnetic waves along the one or more conductor parts is prevented by the one or more filters. Thus, a decrease in power transmittance of the electromagnetic waves in the coaxial waveguide is prevented. Further, the coaxial waveguide includes a portion extending at a downstream side of the one or more conductor parts, so that a mode of the electromagnetic waves is corrected during the propagation of the electromagnetic waves in that portion.

In one exemplary embodiment, the plasma processing apparatus may include a plurality of conductor parts as the one or more conductor parts, or may include a plurality of filters as the one or more filters. The plurality of conductor parts and the plurality of filters are evenly arranged in a circumferential direction around a circumference of the coaxial waveguide.

In one exemplary embodiment, the inner conductor may further provide a coolant flow path. The plurality of conductor parts may further include a coolant introduction pipe connected to the coolant flow path and a coolant discharge pipe connected to the coolant flow path.

In one exemplary embodiment, the coaxial waveguide has a downstream portion extending from a connection region between the one or more filters or the one or more conductor parts and the coaxial waveguide toward the introducer. The downstream portion may have a length of 30 mm or more.

In one exemplary embodiment, each of the one or more filters may further include a dielectric part provided between the cover conductor and the corresponding conductor part.

In one exemplary embodiment, an outer diameter of the dielectric part may be 2.5 times or more than an outer diameter of the corresponding conductor part.

In one exemplary embodiment, the plasma processing apparatus may further include a substrate supporter provided inside the chamber. The coaxial waveguide and the chamber may share a central axis. The coaxial waveguide may extend vertically above the chamber. The shower head may be provided above the substrate supporter.

In one exemplary embodiment, the plurality of gas holes may be arranged circumferentially about the central axis.

In one exemplary embodiment, the introducer is made of a dielectric material. The introducer may be attached to the coaxial waveguide so as to close a lower end of the coaxial waveguide, and may extend circumferentially about the central axis.

In one exemplary embodiment, the shower head may constitute an upper electrode. The inner conductor may have a lower end connected to the upper electrode. The introducer is made of a dielectric material. The introducer may extend circumferentially about the central axis so as to surround the upper electrode.

In one exemplary embodiment, the plasma processing apparatus may further include a radio-frequency power supply connected to the coaxial waveguide. The filter may have a length of $\lambda/4-\lambda\times 0.1$ or more and $\lambda/4+\lambda\times 0.1$ or less. Here, $\lambda$ is a wavelength in the filter of electromagnetic waves generated by the radio-frequency power supply.

Hereinafter, various exemplary embodiments will be described in detail with reference to the drawings. In addition, the same reference numerals will be given to the same or corresponding parts in each drawing.

Figure 2:
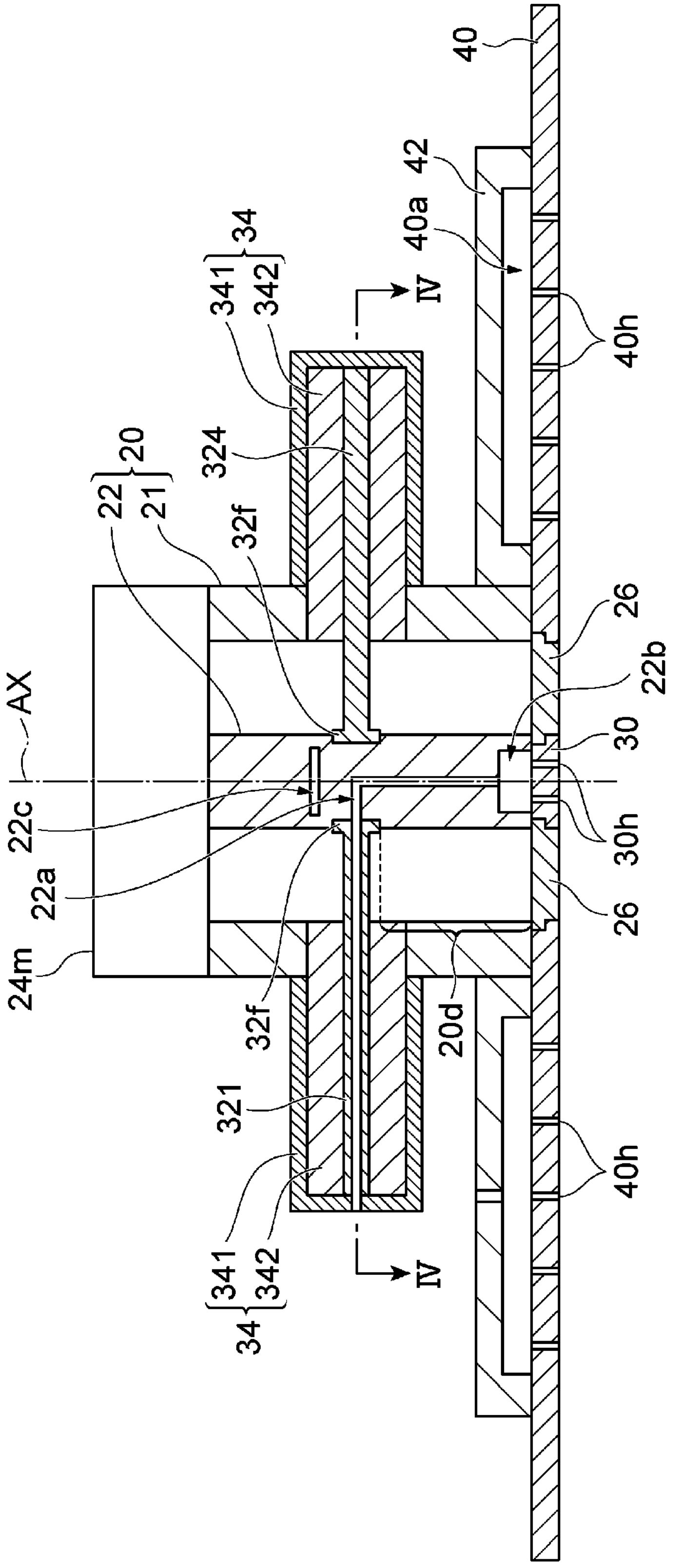
FIG. 2 is a partially enlarged cross-sectional view of the plasma processing apparatus according to one exemplary embodiment.
Figure 3:
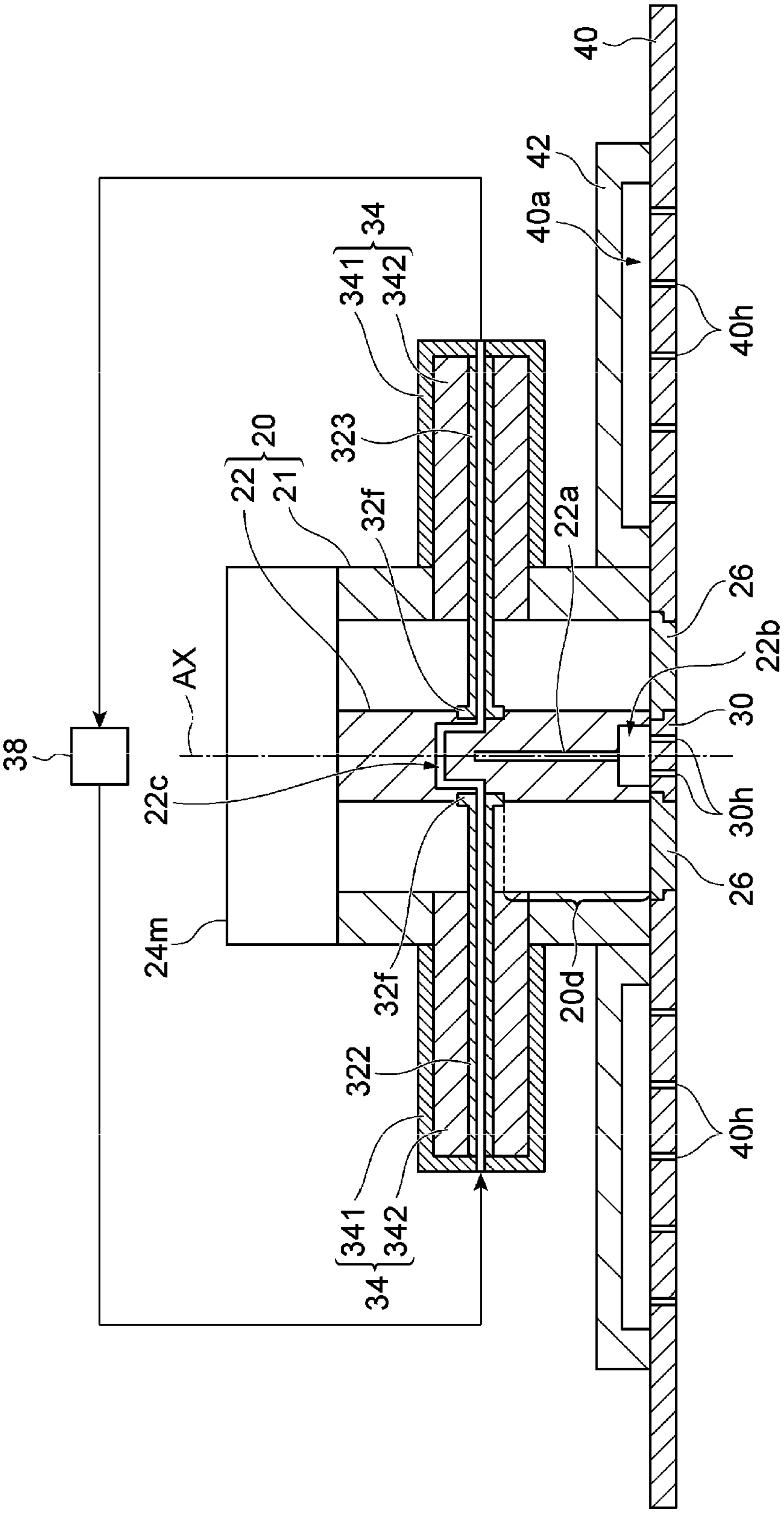
FIG. 3 is another partially enlarged cross-sectional view of the plasma processing apparatus according to one exemplary embodiment.
Figure 4:
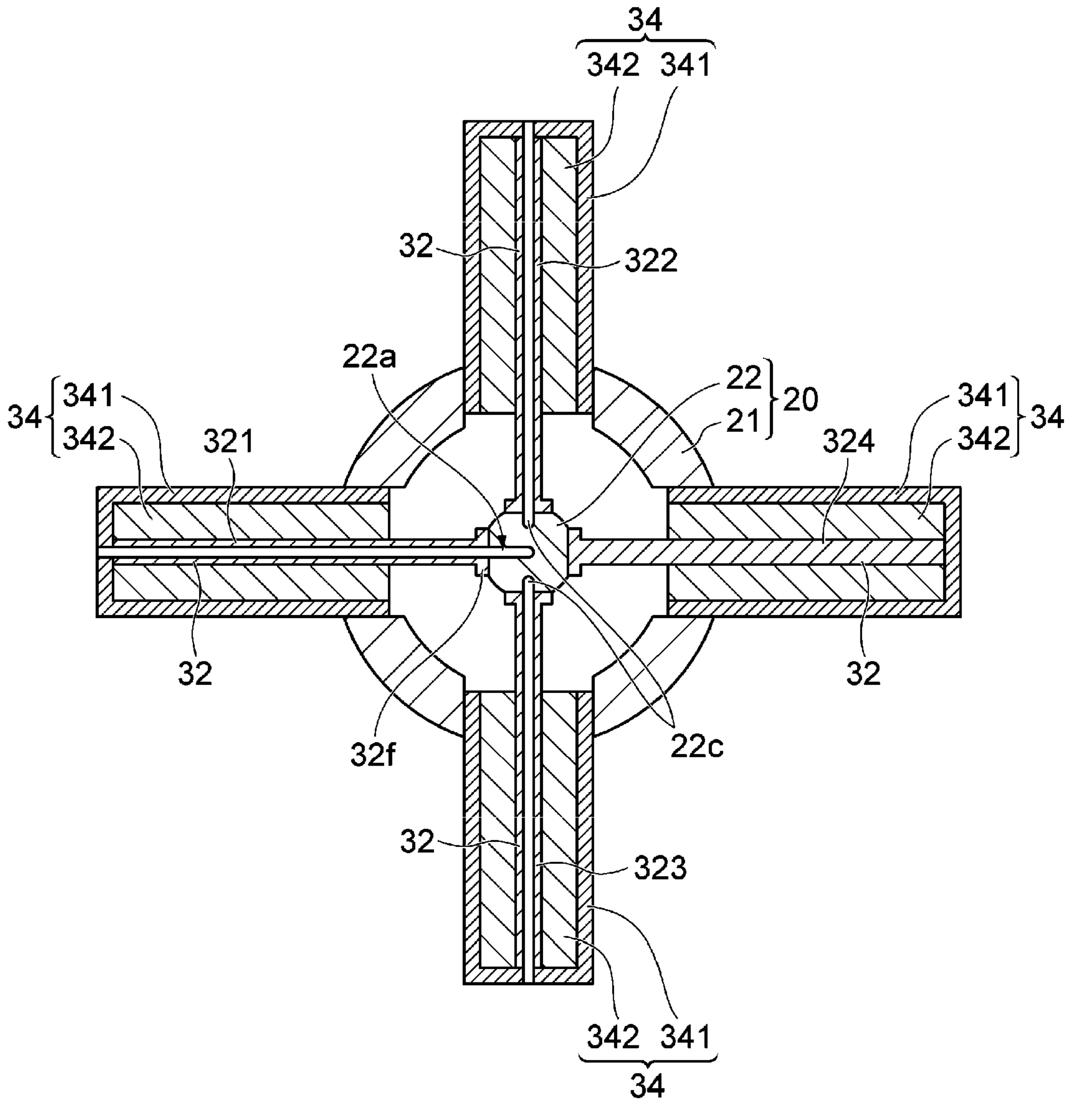
FIG. 4 is a cross-sectional view taken along line IV-IV in FIG. 2.

FIG. 1 is a view illustrating a plasma processing apparatus according to one exemplary embodiment. FIGS. 2 and 3 are partially enlarged cross-sectional views of the plasma processing apparatus according to one exemplary embodiment. FIG. 4 is a cross-sectional view taken along line IV-IV in FIG. 2. The plasma processing apparatus 1 illustrated in FIGS. 1 to 4 is configured to generate plasma using electromagnetic waves. The electromagnetic waves are VHF waves or UHF waves. A band of the VHF waves ranges from 30 MHz to 300 MHz, and a band of the UHF waves ranges from 300 MHz to 3 GHz.

The plasma processing apparatus 1 includes a chamber 10. The chamber 10 defines an internal space. A substrate W is processed in an internal space of the chamber 10. The chamber 10 has an axis AX as the central axis thereof. The axis AX is a vertically-extending axis.

In one embodiment, the chamber 10 may include a chamber main body 12. The chamber main body 12 has a substantially cylindrical shape and is open at the top thereof. The chamber main body 12 provides a sidewall and bottom portion of the chamber 10. The chamber main body 12 is made of a metal such as aluminum. The chamber main body 12 is grounded.

The bottom portion of the chamber 10 provides an exhaust port. The exhaust port is connected to an exhaust device 16. The exhaust device 16 includes a pressure controller such as an automatic pressure control valve and a vacuum pump such as a turbo molecular pump.

The plasma processing apparatus 1 further include a substrate supporter 18. The substrate supporter 18 is provided inside the chamber 10. The substrate supporter 18 is configured to support the substrate W placed thereon. The substrate W is placed on the substrate supporter 18 in a substantially horizontal posture. The substrate supporter 18 may be supported by a support member 19. The support member 19 extends upward from the bottom portion of the chamber 10.

The substrate supporter 18 provides a lower electrode. In one embodiment, the lower electrode is grounded. The substrate supporter 18 may be made of a metal such as aluminum and may constitute a lower electrode. Alternatively, the substrate supporter 18 may be made of a dielectric material such as an aluminum nitride and may provide a lower electrode therein.

The plasma processing apparatus 1 further includes a coaxial waveguide 20. The coaxial waveguide 20 includes an outer conductor 21 and an inner conductor 22. The outer conductor 21 has a substantially cylindrical shape and is made of a metal such as aluminum. The inner conductor 22 has a substantially cylindrical shape or a substantially columnar shape, and is made of a metal such as aluminum. The inner conductor 22 is provided coaxially with the outer conductor 21 within an inner bore of the outer conductor 21. In one embodiment, the coaxial waveguide 20 extends vertically above the chamber 10 and shares the axis AX as the central axis thereof with the chamber 10.

The inner conductor 22 provides a gas flow path **22*a* therein. In one embodiment, the gas flow path 22*a* extends horizontally from an inlet thereof provided on a side surface of the inner conductor 22, and then extends downward either along the axis AX or on the axis AX. In one embodiment, the inner conductor 22 may further provide a gas diffusion chamber 22*b* therein. An outlet of the gas flow path 22*a* is connected to the gas diffusion chamber 22*b*. The gas diffusion chamber 22*b* is formed in a lower end portion of the inner conductor 22**.

In one embodiment, the inner conductor 22 may further provide a coolant flow path **22*c*. An inlet and outlet of the coolant flow path 22*c* are formed at symmetrical positions on the side surface of the inner conductor 22. The coolant flow path 22***c* extends horizontally from the inlet thereof, and then extends upward and is connected to a substantially circular cavity thereof. The coolant flow path 22*c* extends downward from the cavity and extends horizontally to the outlet thereof.

A radio-frequency power supply 24 is connected to the coaxial waveguide 20 via a matcher 24*m*. In one embodiment, the radio-frequency power supply 24 is connected to one end (upper end) of the coaxial waveguide 20 via the matcher 24*m*. The radio-frequency power supply 24 is a power supply configured to generate electromagnetic waves such as VHF waves or UHF waves. The matcher 24*m* includes a matching circuit for matching a load impedance of the radio-frequency power supply 24 to an output impedance of the radio-frequency power supply 24. The electromagnetic waves generated by the radio-frequency power supply 24 are input to the coaxial waveguide 20 via the matcher 24*m*, and are output to an introducer 26 from an output end, which is the other end (lower end) of the coaxial waveguide 20.

The introducer 26 is provided to introduce the electromagnetic waves output from the coaxial waveguide 20 into the chamber 10. The introducer 26 is made of a dielectric material such as an aluminum oxide. In one embodiment, the introducer 26 may be attached to the coaxial waveguide so as to close the lower end of the coaxial waveguide 20. In this embodiment, the introducer 26 has a substantially annular shape and extends circumferentially about the axis AX. Further, in this embodiment, an inner diameter of the introducer 26 is smaller than an outer diameter of the inner conductor 22, and an outer diameter of the introducer 26 is larger than an inner diameter of the outer conductor 21. In addition, the inner diameter of the introducer 26 at an introduction surface to the chamber 10 is approximately equal to the outer diameter of the inner conductor 22. Similarly, the outer diameter of the introducer 26 at the introduction surface to the chamber 10 is approximately equal to the inner diameter of the outer conductor 21.

In one embodiment, the plasma processing apparatus 1 further includes a shower head 30. The shower head 30 provides a plurality of gas holes 30*h* that are open toward the internal space of the chamber 10. The plurality of gas holes 30*h* are connected to the gas flow path 22*a* via the gas diffusion chamber 22*b*. In one embodiment, the shower head 30 is provided above the substrate supporter 18. The shower head 30 may have a substantially disk shape. The shower head 30 is attached to the lower end of the inner conductor 22 so as to close the gas diffusion chamber 22*b* and is surrounded by the introducer 26. The plurality of gas holes 30*h* are connected to the gas diffusion chamber 22*b*, and pass through the shower head 30 in a thickness direction. In one embodiment, the plurality of gas holes 30*h* are arranged circumferentially about the axis AX.

The plasma processing apparatus 1 further includes one or more conductor parts 32. In one embodiment, the plasma processing apparatus 1 further includes a plurality of conductor parts 32. The plurality of conductor parts 32 are made of a metal such as aluminum. Each of the plurality of conductor parts 32 is a cylindrical pipe or a columnar rod.

Each of the plurality of conductor parts 32 extends in a direction crossing the coaxial waveguide 20 (e.g., in the horizontal direction). In one embodiment, the plurality of conductor parts 32 may be arranged evenly, i.e., equidistantly along the circumferential direction about the axis AX. Each of the plurality of conductor parts 32 is connected to the inner conductor 22 between one end (upper end) used as a first end and the other end (lower end) used as a second end of the inner conductor 22. In one embodiment, one end of each of the plurality of conductor parts 32 has a flange 32*f*. The flange 32*f* is fixed to the inner conductor 22.

An outer diameter (diameter) of each of the plurality of conductor parts 32 may be 4 mm or more, for example, 10 mm. The maximum current in each of the plurality of conductor parts 32 having such an outer diameter is, for example, ½ or less of an allowable current thereof.

The plurality of conductor parts 32 include a gas pipe 321. A gas supplier 36 is connected to an inlet of the gas pipe 321. An outlet of the gas pipe 321 is connected to the gas flow path 22*a*. The gas supplier 36 is configured to supply a processing gas used for processing the substrate W. The processing gas is, for example, a film formation gas. The processing gas may be another gas such as an etching gas. The processing gas output from the gas supplier 36 flows through the gas pipe 321, the gas flow path 22*a*, and the gas diffusion chamber 22*b*, and is introduced into the chamber 10 from the plurality of gas holes 30*h*.

In one embodiment, the plurality of conductor parts 32 further include a coolant introduction pipe 322 and a coolant discharge pipe 323. The coolant introduction pipe 322 and the coolant discharge pipe 323 are provided symmetrically on opposite sides of a plane including the axis AX. An inlet of the coolant introduction pipe 322 is connected to a chiller unit 38. An outlet of the coolant introduction pipe 322 is connected to the inlet of the coolant flow path 22*c*. An inlet of the coolant discharge pipe 323 is connected to the outlet of the coolant flow path 22*c*. An outlet of the coolant discharge pipe 323 is connected to the chiller unit 38. A coolant output from the chiller unit 38 is supplied to the coolant flow path 22*c* via the coolant introduction pipe 322. The coolant flowing through the coolant flow path 22*c* is returned to the chiller unit 38 via the coolant discharge pipe 323. In this way, a temperature of the inner conductor 22 is controlled through the chiller unit 38.

In one embodiment, the plurality of conductor parts 32 may further include a dummy conductor 324. The dummy conductor 324 is a columnar rod. The dummy conductor 324 may be a cylindrical pipe. The dummy conductor 324 and the gas pipe 321 are provided symmetrically on opposite sides of a plane including the axis AX.

The plasma processing apparatus 1 further includes a ceiling part 40. The ceiling part 40 is made of a metal such as aluminum. The ceiling part 40 has a substantially disk shape, and provides an opening at the center thereof. The ceiling part 40 is provided on the chamber main body 12 so as to close an upper opening of the chamber main body 12 together with the introducer 26 and the shower head 30 provided in the opening thereof.

In one embodiment, the ceiling part 40 provides a plurality of gas holes 40*h*. The plurality of gas holes 40*h* are open toward the internal space of the chamber 10. The plurality of gas holes 40*h* pass through the ceiling part 40 and are arranged along a plurality of concentric circles centered on the axis AX.

The plasma processing apparatus 1 may further include a cover member 42. The cover member 42 is provided on the ceiling part 40 and provides a gas diffusion chamber 40*a* together with the ceiling part 40. The plurality of gas holes 40*h* are connected to the gas diffusion chamber 40*a*. Further, a gas supplier 44 is connected to the gas diffusion chamber 40*a*. The gas supplier 44 is configured to supply a processing gas used for processing the substrate W. The processing gas is, for example, a film formation gas. The processing gas may be another gas such as an etching gas. The processing gas output from the gas supplier 44 flows through the gas diffusion chamber 40*a* and is introduced into the chamber 10 from the plurality of gas holes 40*h*.

The plasma processing apparatus 1 further includes one or more filters 34. In one embodiment, the plasma processing apparatus 1 further includes a plurality of filters 34. Each of the filters 34 includes a cylindrical cover conductor 341. The cover conductor 341 is made of a metal such as aluminum. The cover conductor 341 is provided to surround a corresponding conductor part among the plurality of conductor parts 32. One end (a third end) of the cover conductor 341 is connected to the outer conductor 21. The other end (a fourth end) of the cover conductor 341 is a short-circuit end and is connected to the corresponding conductor part among the plurality of conductor parts 32.

The plurality of filters 34 are configured to prevent electromagnetic waves from propagating around the plurality of conductor parts 32. The plurality of filters 34 may have a length of $\lambda/4-\lambda\times0.1$ or more and $\lambda/4+\lambda\times0.1$ or less. Here, k is the wavelength in each of the plurality of filters 34 of electromagnetic waves generated by the radio-frequency power supply 24. The plurality of filters 34 having such a length have a substantially infinite impedance in terms of the coaxial waveguide 20. Thus, the propagation of the electromagnetic waves around the plurality of conductor parts 32 is prevented.

According to the plasma processing apparatus 1, it is possible to introduce a gas into the chamber 10 via the gas pipe 321, the gas flow path 22*a* of the inner conductor 22, and the shower head 30. Further, discharge within the gas pipe 321 is prevented since the gas pipe 321 is made of a metal. Further, the plurality of conductor parts 32 cross the coaxial waveguide 20, and the propagation of the electromagnetic waves along the plurality of conductor parts 32 is prevented by the plurality of filters 34. Thus, a decrease in power transmittance of the electromagnetic waves in the coaxial waveguide 20 is prevented.

Further, the coaxial waveguide 20 includes a portion extending at the downstream side of the plurality of conductor parts 32, i.e., a downstream portion 20*d*, so that a mode of the electromagnetic waves disturbed by the plurality of conductor parts 32 is corrected into a TEM mode. In addition, the downstream portion 20*d* is a portion extending from a connection region between the plurality of filters 34 or the plurality of conductor parts 32 and the coaxial waveguide 20 toward the introducer 26. That is, the downstream portion 20*d* is a portion from the connection region to the lower end of the coaxial waveguide 20. A lower end of the connection region between the plurality of filters 34 or the plurality of conductor parts 32 and the coaxial waveguide 20 is a lower end of a region where the inner diameter or outer diameter of the coaxial waveguide 20 varies. An example of such a region is the flange 32*f*. In one embodiment, a length of the downstream portion 20*d*, i.e., a length from the connection region to the lower end of the coaxial waveguide 20 may be 30 mm or more.

Further, in the plasma processing apparatus 1, the other end of the cover conductor 341 is short-circuited, so that the length of each of the plurality of filters 34 is shortened. In one embodiment, each of the plurality of filters 34 may further include a dielectric part 342 provided between the cover conductor 341 and a corresponding conductor part among the plurality of conductor parts 32. The dielectric part 342 has a substantially cylindrical shape and fills a gap between the cover conductor 341 and the corresponding conductor part among the plurality of conductor parts 32. The dielectric part 342 is made of, for example, an aluminum oxide. The dielectric part 342 shortens the wavelength of electromagnetic waves in each filter 34. Thus, according to the dielectric part 342, the length of each of the plurality of filters 34 is further shortened.

In one embodiment, the outer diameter of the dielectric part 342 (i.e., the inner diameter of the cover conductor 341) is 2.5 times or more than the outer diameter of the corresponding conductor part among the plurality of conductor parts 32. When the dielectric part 342 has such an outer diameter, a decrease in the power transmittance of the electromagnetic waves in the coaxial waveguide 20 is prevented. In addition, the outer diameter (diameter) of the dielectric part 342 is, for example, 30 mm.

Figure 5A:
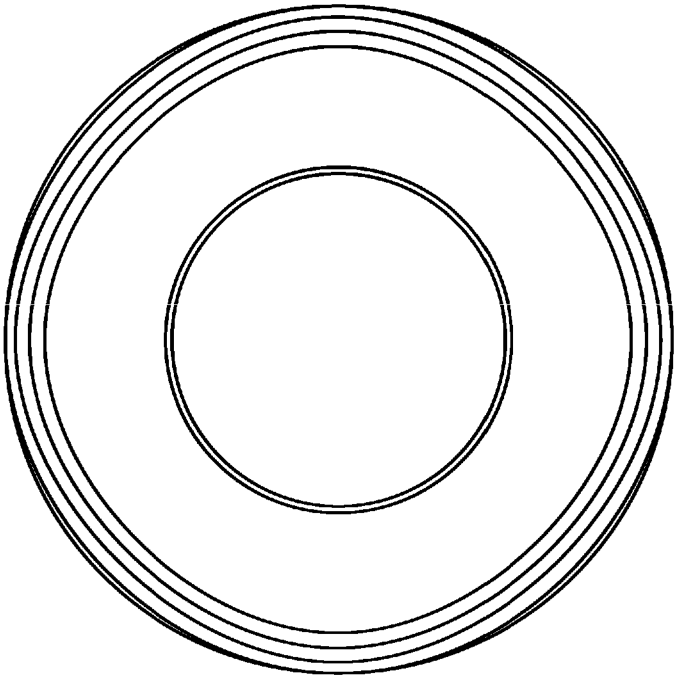
FIGS. 5A and 5B are views illustrating results of a first simulation.
Figure 5B:
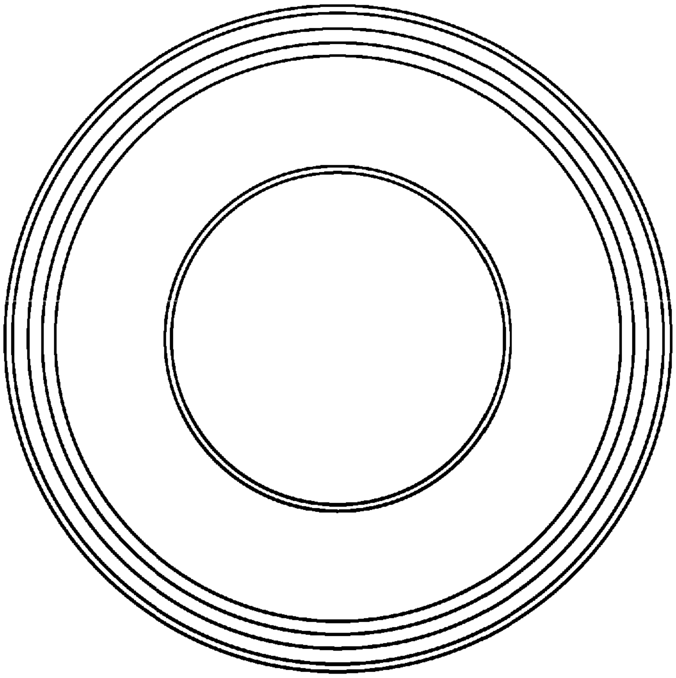

Hereinafter, a first simulation conducted to evaluate the plasma processing apparatus 1 will be described. In the first simulation, the electric field intensity distribution was calculated at the other end (lower end) of the coaxial waveguide 20 while changing the length of the downstream portion 20*d*. In the first simulation, the length of the downstream portion 20*d* was set to 20 mm and 30 mm. The electric field intensity distribution for a case where the length of the downstream portion 20*d* is 20 mm is illustrated in FIG. 5A, and the electric field intensity distribution for a case where the length of the downstream portion 20*d* is 30 mm is illustrated in FIG. 5B. In each of FIG. 5A and FIG. 5B, the electric field intensity distribution is depicted by a plurality of equifield intensity lines. As illustrated in FIG. 5A, even when the length of the downstream portion 20*d* is 20 mm, the electric field intensity distribution is considerably close to the electric field intensity distribution of the TEM mode. As illustrated in FIG. 5B, when the length of the downstream portion 20*d* is 30 mm, the electric field intensity distribution conforms to the electric field intensity distribution of the TEM mode. Thus, it was confirmed from the results of the first simulation that the mode of electromagnetic waves is sufficiently corrected when the length of the downstream portion 20*d* is 30 mm.

Hereinafter, a second simulation conducted to evaluate the plasma processing apparatus 1 will be described. In the second simulation, the power transmittance (PTR) in the coaxial waveguide 20 was calculated while changing the outer diameter (diameter) of the dielectric part 342 made of an aluminum oxide and the outer diameter (diameter) of the conductor part 32. Specifically, in each of cases where the outer diameter of the dielectric part 342 is 30 mm and 40 mm, the outer diameter of the conductor part 32 was set to 6.4 mm, 10 mm, 15 mm, and 20 mm, respectively. In the second simulation, the power transmittance (PTR, %) was calculated by the following equation (1). In the following equation (1), $S_{11}$ is the reflection coefficient.

$$PTR=(1-S_{11}^{2})\times100 \tag{1}$$

Figure 6:
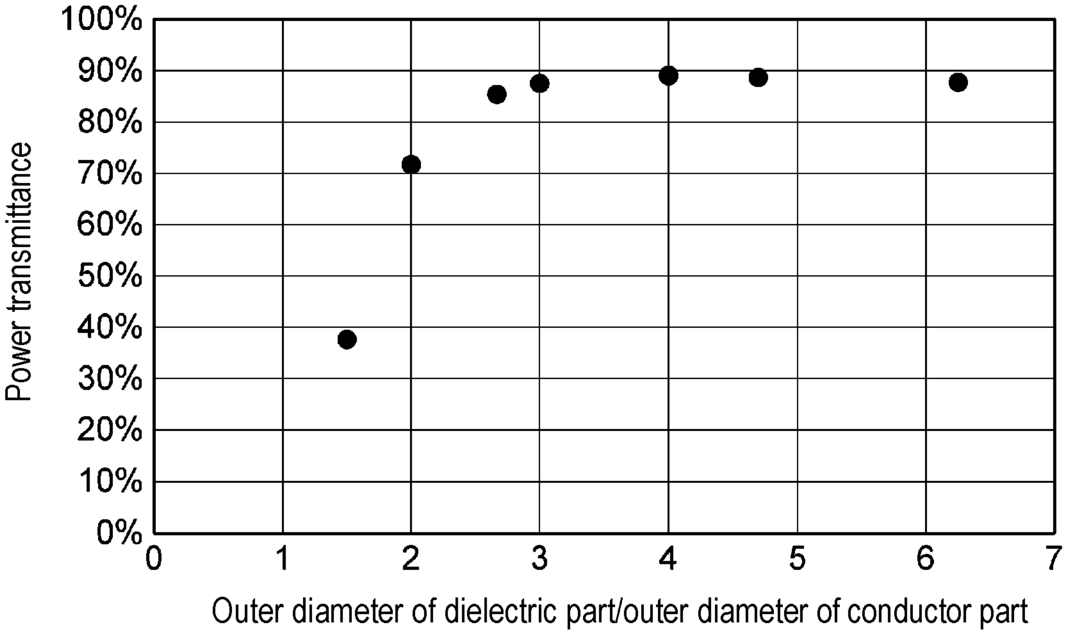
FIG. 6 is a view illustrating results of a second simulation.

In the second simulation, a relationship between a ratio of the outer diameter of the dielectric part 342 to the outer diameter of the conductor part 32 and the power transmittance (PTR) was calculated. The results are illustrated in FIG. 6. As illustrated in FIG. 6, when a value of the ratio of the outer diameter of the dielectric part 342 to the outer diameter of the conductor part 32 is 2.5 or more, the power transmittance (PTR) is approximately 90%, which indicates a significantly high value. Thus, it was confirmed from the results of the second simulation that when the outer diameter of the dielectric part 342 is 2.5 times or more than the outer diameter of the conductor part 32, a significantly high power transmittance is obtained.

Figure 7:
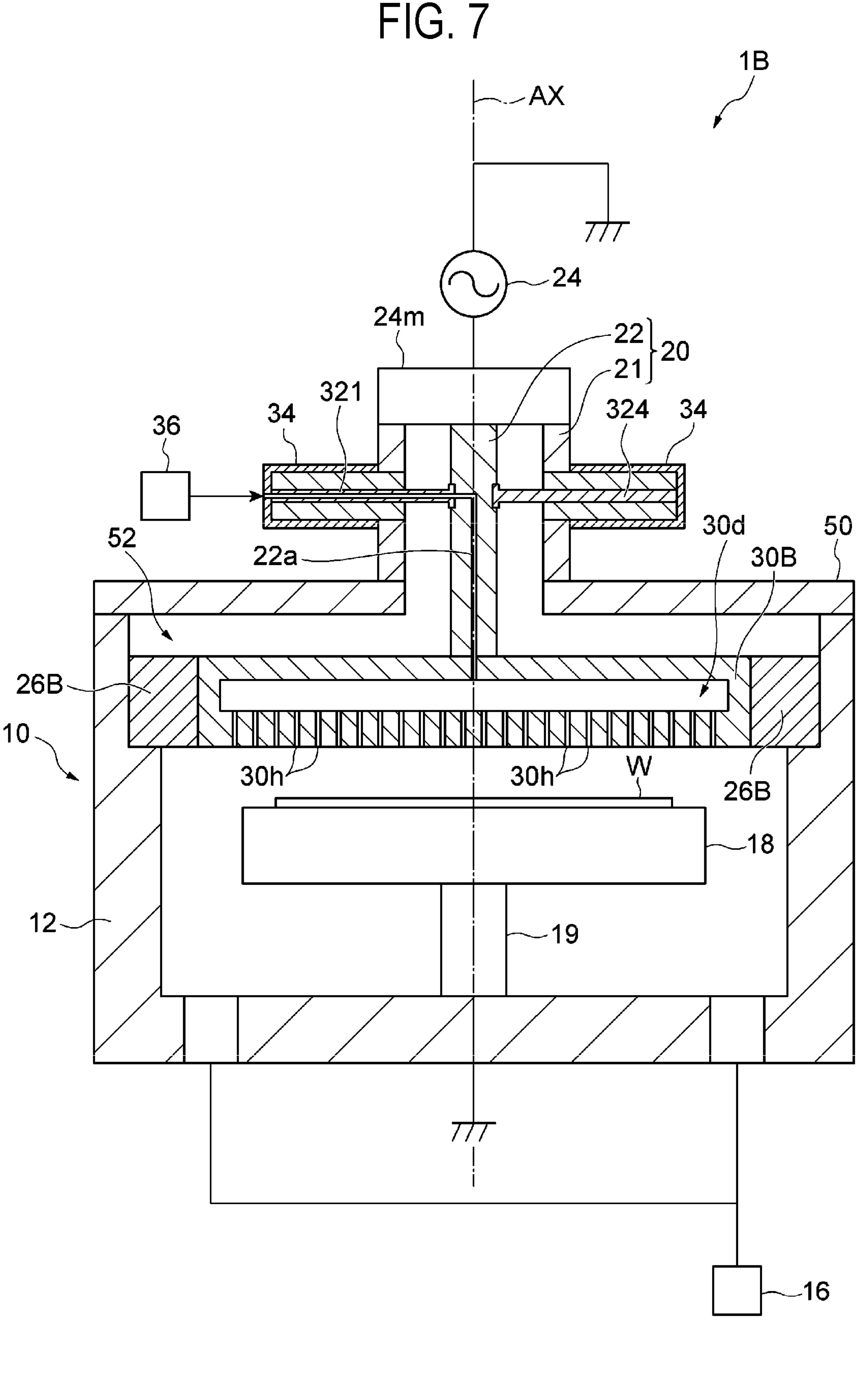
FIG. 7 is a view illustrating a plasma processing apparatus according to another exemplary embodiment.

Hereinafter, reference will be made to FIG. 7. FIG. 7 is a view illustrating a plasma processing apparatus according to another exemplary embodiment. Hereinafter, differences between a plasma processing apparatus 1B illustrated in FIG. 7 and the plasma processing apparatus 1 will be described.

The plasma processing apparatus 1B includes a shower head 30B. The shower head 30B is provided above the substrate supporter 18. The shower head 30B has a substantially disk shape. The shower head 30B is made of a metal such as aluminum and constitutes an upper electrode. In the plasma processing apparatus 1B, the lower end of the inner conductor 22 is connected to the shower head 30B, i.e., the upper electrode.

The shower head 30B provides a gas diffusion chamber 30*d* therein. The gas flow path 22*a* of the inner conductor 22 is connected to the gas diffusion chamber 30*d* of the shower head 30B. The shower head 30B also provides the plurality of gas holes 30*h*. The plurality of gas holes 30*h* extend downward from the gas diffusion chamber 30*d*, and are open toward the internal space of the chamber 10.

The plasma processing apparatus 1B further includes a top wall 50. The top wall 50 has a disk shape and is open at the center thereof. The top wall 50 is made of a metal such as aluminum. The top wall 50 is provided on the chamber main body 12 so as to close the upper opening of the chamber main body 12. In the plasma processing apparatus 1B, the lower end of the outer conductor 21 is connected to the top wall 50. The top wall 50 is provided above the shower head 30B so as to provide a waveguide 52 between the shower head 30B and the top wall 50. The waveguide 52 extends radially with respect to the axis AX.

The plasma processing apparatus 1B further includes an introducer 26B. The introducer 26B is made of a dielectric material such as an aluminum oxide. The introducer 26B may have a ring shape. The introducer 26B is provided along the outer periphery of the shower head 30B. That is, the introducer 26B extends circumferentially about the axis AX so as to surround the shower head 30B. In the plasma processing apparatus 1B, the electromagnetic waves propagate from the coaxial waveguide 20 to the waveguide 52, and then propagate radially in the waveguide 52 and are introduced into the chamber 10 from the outer periphery of the shower head 30B via the introducer 26B.

While various exemplary embodiments have been described above, various additions, omissions, substitutions, and modifications may be made without being limited to the exemplary embodiments described above. Further, elements from different embodiments may be combined to form other embodiments.

For example, the number of conductor parts 32 in the plasma processing apparatus may be one. In this case, the plasma processing apparatus does not have to include the coolant introduction pipe 322, the coolant discharge pipe 323, and the dummy conductor 324. Further, the number of conductor parts 32 in the plasma processing apparatus may be three. In this case, the plasma processing apparatus does not have to include the dummy conductor 324.

Further, it will be understood from the above description that various embodiments of the present disclosure have been set forth herein for purpose of illustration, and that various changes may be made without departing from the scope and spirit of the present disclosure. Accordingly, the various embodiments disclosed herein are not intended to be limiting, and the true scope and spirit are indicated by the appended claims.

EXPLANATION OF REFERENCE NUMERALS

1: plasma processing apparatus, 10: chamber, 18: substrate supporter, 20: coaxial waveguide, 21: outer conductor, 22: inner conductor, 22*a*: gas flow path, 24: radio-frequency power supply, 32: conductor part, 321: gas pipe, 34: filter

What is claimed is:

1. A plasma processing apparatus comprising:
a chamber;
a coaxial waveguide including an outer conductor of a cylindrical shape and an inner conductor provided inward of the outer conductor to provide a gas flow path in the inner conductor;
an introducer provided to introduce electromagnetic waves from the coaxial waveguide into the chamber;
a shower head connected to the gas flow path and configured to provide a plurality of gas holes that are open toward an internal space of the chamber;
one or more conductor parts made of a metal and provided to extend in a direction crossing the coaxial waveguide so as to be connected to the inner conductor between a first end and a second end of the inner conductor, the one or more conductor parts including a gas pipe connected to the gas flow path; and
one or more filters configured to prevent the electromagnetic waves from propagating around the one or more conductor parts, wherein each of the one or more filters includes a cylindrical cover conductor provided to surround a corresponding conductor part among the one or more conductor parts, and the cover conductor includes a third end connected to the outer conductor and a fourth end that is a short-circuit end connected to the corresponding conductor part,
wherein the one or more conductor parts includes a plurality of conductor parts,
wherein the one or more filters includes a plurality of filters, and
wherein the plurality of conductor parts and the plurality of filters are evenly arranged in a circumferential direction around the coaxial waveguide.

2. The plasma processing apparatus of claim 1, wherein the inner conductor further provides a coolant flow path, and
wherein the plurality of conductor parts further include a coolant introduction pipe connected to the coolant flow path and a coolant discharge pipe connected to the coolant flow path.

3. The plasma processing apparatus of claim 2, wherein the coaxial waveguide has a downstream portion extending from a connection region between the one or more filters or the one or more conductor parts and the coaxial waveguide toward the introducer, and the downstream portion has a length of 30 mm or more.

4. The plasma processing apparatus of claim 3, wherein each of the one or more filters further includes a dielectric part provided between the cover conductor and the corresponding conductor part.

5. The plasma processing apparatus of claim 4, wherein an outer diameter of the dielectric part is 2.5 times or more than an outer diameter of the corresponding conductor part.

6. The plasma processing apparatus of claim 5, further comprising a substrate supporter provided in the chamber,
wherein the coaxial waveguide and the chamber share a central axis,
wherein the coaxial waveguide extends vertically above the chamber, and
wherein the shower head is provided above the substrate supporter.

7. The plasma processing apparatus of claim 6, wherein the introducer is made of a dielectric material, is attached to the coaxial waveguide so as to close a lower end of the coaxial waveguide, and extends in the circumferential direction about the central axis.

8. The plasma processing apparatus of claim 6, wherein the shower head constitutes an upper electrode, wherein a lower end of the inner conductor is connected to the upper electrode, and wherein the introducer is made of a dielectric material and extends in the circumferential direction about the central axis so as to surround the upper electrode.

9. The plasma processing apparatus of claim 6, wherein the plurality of gas holes are arranged in the circumferential direction about the central axis.

10. The plasma processing apparatus of claim 9, wherein the introducer is made of a dielectric material, is attached to the coaxial waveguide so as to close a lower end of the coaxial waveguide, and extends in the circumferential direction about the central axis.

11. The plasma processing apparatus of claim 9, wherein the shower head constitutes an upper electrode, wherein a lower end of the inner conductor is connected to the upper electrode, and wherein the introducer is made of a dielectric material and extends in the circumferential direction about the central axis so as to surround the upper electrode.

12. The plasma processing apparatus of claim 11, further comprising a radio-frequency power supply connected to the coaxial waveguide, wherein each of the one or more filters has a length of $\lambda/4-\lambda\times0.1$ or more and $\lambda/4+\lambda\times0.1$ or less, where $\lambda$ is a wavelength of the electromagnetic waves, which is generated by the radio-frequency power supply, in each of the one or more filters.

13. The plasma processing apparatus of claim 10, further comprising a radio-frequency power supply connected to the coaxial waveguide, wherein each of the one or more filters has a length of $\lambda/4-\lambda\times0.1$ or more and $\lambda 4+\lambda\times0.1$ or less, where $\lambda$ is a wavelength of the electromagnetic waves, which is generated by the radio-frequency power supply, in each of the one or more filters.

14. The plasma processing apparatus of claim 1, wherein the coaxial waveguide has a downstream portion extending from a connection region between the one or more filters or the one or more conductor parts and the coaxial waveguide toward the introducer, and the downstream portion has a length of 30 mm or more.

15. The plasma processing apparatus of claim 1, further comprising a substrate supporter provided in the chamber, wherein the coaxial waveguide and the chamber share a central axis, wherein the coaxial waveguide extends vertically above the chamber, and wherein the shower head is provided above the substrate supporter.

16. The plasma processing apparatus of claim 1, further comprising a radio-frequency power supply connected to the coaxial waveguide, wherein each of the one or more filters has a length of $\lambda/4-\lambda\times0.1$ or more and $\lambda 4+\lambda\times0.1$ or less, where $\lambda$ is a wavelength of the electromagnetic waves, which is generated by the radio-frequency power supply, in each of the one or more filters.

17. A plasma processing apparatus comprising:

a chamber;

a coaxial waveguide including an outer conductor of a cylindrical shape and an inner conductor provided inward of the outer conductor to provide a gas flow path in the inner conductor;

an introducer provided to introduce electromagnetic waves from the coaxial waveguide into the chamber;

a shower head connected to the gas flow path and configured to provide a plurality of gas holes that are open toward an internal space of the chamber;

one or more conductor parts made of a metal and provided to extend in a direction crossing the coaxial waveguide so as to be connected to the inner conductor between a first end and a second end of the inner conductor, the one or more conductor parts including a gas pipe connected to the gas flow path; and one or more filters configured to prevent the electromagnetic waves from propagating around the one or more conductor parts, wherein each of the one or more filters includes a cylindrical cover conductor provided to surround a corresponding conductor part among the one or more conductor parts, and the cover conductor includes a third end connected to the outer conductor and a fourth end that is a short-circuit end connected to the corresponding conductor part, wherein each of the one or more filters further includes a dielectric part provided between the cover conductor and the corresponding conductor part.

18. The plasma processing apparatus of claim 17, wherein an outer diameter of the dielectric part is 2.5 times or more than an outer diameter of the corresponding conductor part.

19. The plasma processing apparatus of claim 17, further comprising a substrate supporter provided in the chamber, wherein the coaxial waveguide and the chamber share a central axis, wherein the coaxial waveguide extends vertically above the chamber, and wherein the shower head is provided above the substrate supporter.

20. The plasma processing apparatus of claim 17, further comprising a radio-frequency power supply connected to the coaxial waveguide, wherein each of the one or more filters has a length of $\lambda/4-\lambda\times0.1$ or more and $\lambda/4+\lambda\times0.1$ or less, where $\lambda$ is a wavelength of the electromagnetic waves, which is generated by the radio-frequency power supply, in each of the one or more filters.

* * * * *